(12) United States Patent
Im et al.

(10) Patent No.: US 12,476,397 B2
(45) Date of Patent: Nov. 18, 2025

(54) TRANSFER MOLDED POWER MODULES AND METHODS OF MANUFACTURE

(71) Applicant: SEMICONDUCTOR COMPONENTS INDUSTRIES, LLC, Scottsdale, AZ (US)

(72) Inventors: Seungwon Im, Bucheon (KR); Oseob Jeon, Seoul (KR); Dongwook Kang, Bucheon (KR); Youngsun Ko, Incheon (KR); Jeungdae Kim, Gimpo (KR); Changsun Yun, Seoul (KR); Jihwan Kim, Seoul (KR)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 422 days.

(21) Appl. No.: 18/190,725

(22) Filed: Mar. 27, 2023

(65) Prior Publication Data
US 2023/0327350 A1    Oct. 12, 2023

Related U.S. Application Data

(60) Provisional application No. 63/362,638, filed on Apr. 7, 2022.

(51) Int. Cl.
*H01R 12/58* (2011.01)
*H01R 43/16* (2006.01)
*H01R 43/26* (2006.01)

(52) U.S. Cl.
CPC .......... *H01R 12/585* (2013.01); *H01R 43/16* (2013.01); *H01R 43/26* (2013.01)

(58) Field of Classification Search
CPC ...... H01R 12/585; H01R 43/16; H01R 43/26; H01R 12/58; H01L 25/115;
(Continued)

(56) References Cited

U.S. PATENT DOCUMENTS 4,778,404 A * 10/1988 Pass ................... H01R 13/2428
439/948
5,122,066 A * 6/1992 Plossmer ............. H01R 12/716
439/246
(Continued)

FOREIGN PATENT DOCUMENTS

JP    2000208686 A    7/2000
JP    2009059812 A    3/2009

OTHER PUBLICATIONS

Extended European Search Report for counterpart EP Application No. 23166654.6, mailed Sep. 14, 2023, 9 pages.

*Primary Examiner* — Truc T Nguyen
(74) *Attorney, Agent, or Firm* — Brake Hughes Bellermann LLP

(57) ABSTRACT

In a general aspect, an electronic device assembly includes a substrate arranged in a plane. The substrate has a first side and a second side, the second side being opposite the first side. The assembly also includes a plurality of semiconductor die disposed on the first side of the substrate and at least one signal pin. The at least one signal pin includes a proximal end portion coupled with the first side of the substrate, a distal end portion, and a medial portion disposed between the proximal end portion and the distal end portion. The medial portion is pre-molded in a molding compound, the proximal end portion and the distal end portion exclude the molding compound. The at least one signal pin is arranged along a longitudinal axis that is orthogonal to the plane of the substrate.

20 Claims, 9 Drawing Sheets

(58) Field of Classification Search
CPC . H01L 23/3107; H01L 23/3735; H01L 24/49; H01L 25/072; H01L 23/49811; H05K 1/0203; H05K 1/184; H05K 3/308; H05K 2201/1059; H05K 2201/10757; H05K 2201/10795; H05K 2201/10878

See application file for complete search history.

(56) References Cited

U.S. PATENT DOCUMENTS

| | | | | |
|---|---|---|---|---|
| 5,613,879 | A * | 3/1997 | Fonteneau | H01R 13/658 439/607.01 |
| 5,888,096 | A * | 3/1999 | Soes | H01R 13/6586 439/857 |
| 5,967,856 | A * | 10/1999 | Meller | H01R 13/2428 439/700 |
| 6,206,735 | B1 * | 3/2001 | Zanolli | H01R 43/24 439/736 |
| 6,783,405 | B1 * | 8/2004 | Yen | H01R 12/58 439/700 |
| 6,859,054 | B1 * | 2/2005 | Zhou | G01R 1/07314 257/781 |
| 10,128,165 | B2 | 11/2018 | Hable et al. | |
| 10,312,613 | B2 * | 6/2019 | Taylor | H05K 7/023 |
| 10,693,270 | B2 | 6/2020 | Chew et al. | |
| 10,910,296 | B2 | 2/2021 | Beer et al. | |
| 2002/0142669 | A1 * | 10/2002 | Phillips | H01R 13/2428 439/700 |
| 2005/0110505 | A1 * | 5/2005 | Stanley Tsui | G01R 1/06733 324/755.05 |
| 2008/0188108 | A1 * | 8/2008 | Behr | H01R 43/16 439/271 |
| 2008/0311767 | A1 * | 12/2008 | Weber | H01R 12/57 439/62 |
| 2009/0111289 | A1 * | 4/2009 | Vinther | H01R 12/714 439/81 |
| 2012/0052696 | A1 * | 3/2012 | Tay | H01R 13/521 439/55 |
| 2014/0045382 | A1 * | 2/2014 | Ma | H01R 12/585 439/626 |
| 2014/0308850 | A1 * | 10/2014 | Song | H01R 4/2406 439/620.15 |
| 2015/0333420 | A1 * | 11/2015 | Davis | H01R 13/6587 439/712 |
| 2021/0119358 | A1 | 4/2021 | Wu et al. | |
| 2023/0155309 | A1 * | 5/2023 | Lechner | H01R 12/91 439/733.1 |

* cited by examiner

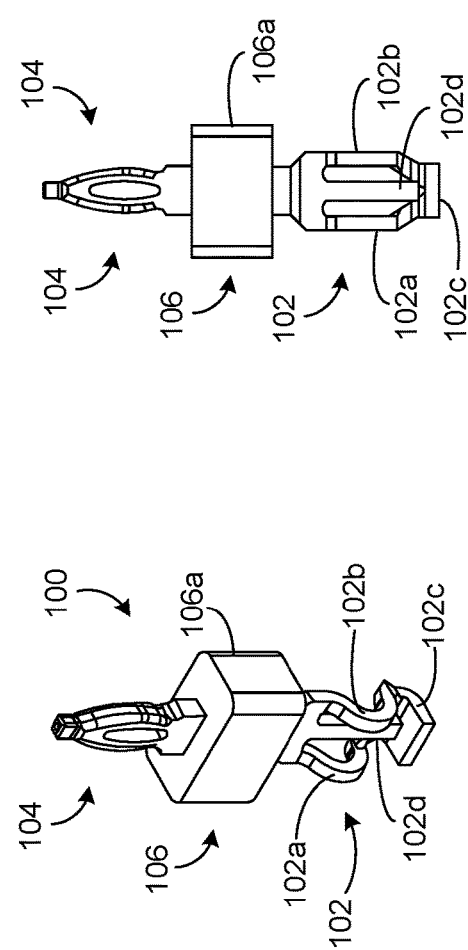
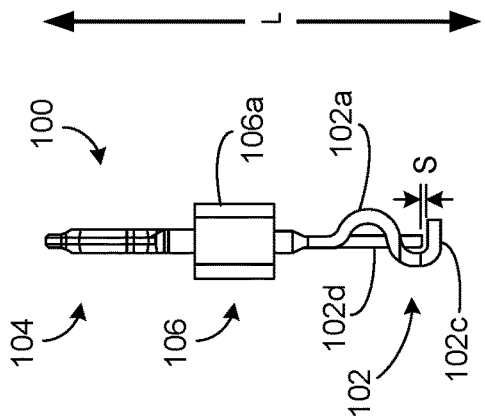
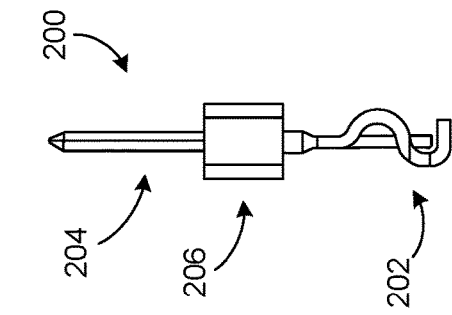
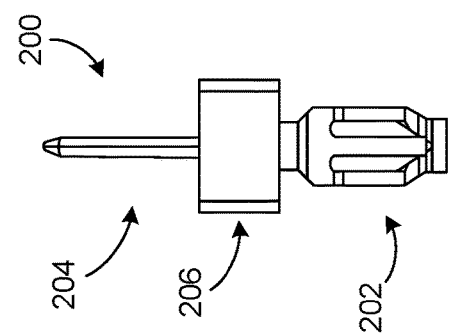

TRANSFER MOLDED POWER MODULES AND METHODS OF MANUFACTURE

RELATED APPLICATION

This application claims priority to and the benefit of U.S. Provisional Application No. 63/362,638, filed on Apr. 7, 2022, entitled "TRANSFER MOLDED POWER MODULE," the disclosure of which is incorporated by reference herein in its entirety.

TECHNICAL FIELD

This description relates to electronic device assemblies. More specifically, this description relates to semiconductor device modules, such as power semiconductor device modules.

BACKGROUND

Semiconductor devices (e.g., semiconductor die) can be included in package assemblies or modules, where such modules can include signal pins (press-fit pins or solder-attached pins) and power tabs that are disposed along sides (edges) of a molded module (e.g., a transfer molded module). Such signal pins can be bent to facilitate insertion into a printed circuit board (PCB). During insertion, the signal pins can be deformed (pushed back) or broken. In some implementations, a guide part or tool can be used to prevent deformation or breakage. However, use of a guide part complicates integration of such modules in a corresponding system and increases total system cost. Furthermore, achieving sufficient spacing between signal pins, e.g., for electrical isolation, can increase the overall module dimensions to accommodate such spacing. Such increased dimensions increase cost and can cause reliability issues due to increased thermo-mechanical stresses.

In some implementations, signal pins and power tabs are included in a leadframe that is formed by a single body stamping process. Such approaches can result in a current flow path between positive (V+) and negative (V−) power tabs of an associated module with undesirably high stray inductance. Additionally, materials used for such single leadframes can degrade electrical and thermal performance of the associated module, as well as increase module cost.

Power semiconductor device modules are typically attached to (coupled with, mounted on, etc.) a thermal-dissipation appliance, such as a heat sink or cooling jacket, to facilitate dissipation of heat generated during electrical operation of the module. Attachment of a power module, e.g., after completion of package assembly, can result in a number of issues. For instance, it can be difficult to achieve a consistent adhesive layer thickness (e.g., as a result of potential warping of the package), or to reduce voids in the adhesive layer (e.g., as a result of package size, and/or oxidation or contamination of surfaces of the module). Further, there is a risk of re-melting (re-flowing) internal solder of the module during attachment of the packaged module to the thermal-dissipation appliance (e.g., due to thermal processing for attachment), and/or inducing thermo-mechanical stresses (e.g., due to temperature and pressure during attachment) that can adversely affect reliability of the module.

SUMMARY

In a general aspect, an electronic device assembly includes a substrate arranged in a plane. The substrate has a first side and a second side, the second side being opposite the first side. The assembly also includes a plurality of semiconductor die disposed on the first side of the substrate and at least one signal pin. The at least one signal pin includes a proximal end portion coupled with the first side of the substrate, a distal end portion, and a medial portion disposed between the proximal end portion and the distal end portion. The medial portion is pre-molded in a molding compound, the proximal end portion and the distal end portion exclude the molding compound. The at least one signal pin is arranged along a longitudinal axis that is orthogonal to the plane of the substrate.

Implementations, can include one or more of the following features, alone or in combination. For example, the proximal end portion of the at least one signal pin can include a spring portion. The spring portion can include a foot having a first surface coupled with the substrate and a second surface opposite the first surface. The proximal end portion can include a mechanical stop portion that is configured, during compression of the spring portion, to contact the second surface of the foot to limit the compression of the spring portion.

The spring portion can be a first spring portion. The proximal end portion of the at least one signal pin can include a second spring portion, the mechanical stop portion can be disposed between the first spring portion and the second spring portion, and the foot can be common with the first spring portion and the second spring portion.

The at least one signal pin can include a plurality of signal pins respectively coupled with the first side of the substrate.

The molding compound can be a first molding compound. The assembly can include a second molding compound encapsulating the plurality of semiconductor die, the proximal end portion of the at least one signal pin, at least a portion of the substrate; and a portion of the first molding compound, such that a surface of the first molding compound is coplanar with a surface of the second molding compound.

The molding compound can be a first molding compound, and the assembly can include at least one power tab coupled with the first side of the substrate. The second molding compound can encapsulate the plurality of semiconductor die, the proximal end portion of at least one signal pin, at least a portion of the substrate, and a portion of the first molding compound, such that a surface of the first molding compound is coplanar with a surface of the second molding compound. The second molding compound can encapsulate a portion of the at least one power tab.

A surface of the at least one power tab can be exposed through the surface of the second molding compound.

The at least one power tab can be coupled with the substrate via a post. The post can be one of columnar, L-shaped, or step-shaped.

The surface of the second molding compound can be a first surface of the second molding compound and the portion of the at least one power tab can be a first portion. A second portion of the at least one power tab can be disposed outside the second molding compound. The second portion of the at least one power tab can extend out of the second molding compound at a second surface of the second molding compound. The second surface of the second molding compound can be non-parallel with the first surface of the second molding compound.

The assembly can include a thermal-dissipation appliance coupled with the second side of the substrate.

In another general aspect, a method for producing an electronic device assembly includes coupling a first side of a substrate with a thermal-dissipation appliance, where the substrate is arranged in a plane. After coupling the substrate with the thermal-dissipation appliance, the method includes coupling a plurality of semiconductor die with a second side of the substrate, the second side being opposite the first side; coupling at least one conductive clip with the second side of the substrate and at least one semiconductor die of the plurality of semiconductor die; and coupling at least one signal pin with the second side of the substrate. The at least one signal pin includes a proximal end portion coupled with the second side of the substrate, a distal end portion, and a medial portion disposed between the proximal end portion and the distal end portion. The medial portion is pre-molded in a molding compound. The proximal end portion and the distal end portion exclude the molding compound. The at least one signal pin is arranged along a longitudinal axis that is orthogonal to the plane of the substrate.

Implementations can include one or more of the following features, alone or in combination. For example, coupling the at least one signal pin with the second side of the substrate can include placing the distal end portion of the at least one signal pin in a cavity of a leveling tool, and positioning a foot of the proximal end portion on the second side of the substrate, such that a spring included in the leveling tool, a spring portion of the proximal end portion, and a mechanical stop portion of the proximal end portion determine a position of the at least one signal pin along the longitudinal axis. Coupling the at least one signal pin with the second side of the substrate can then include soldering a surface of the foot to the second side of the substrate.

The method can include, after coupling the plurality of semiconductor die with the second side of the substrate and before coupling the at least one signal pin with the second side of the substrate, forming a plurality of wire bonds between the substrate and respective semiconductor die of the plurality of semiconductor die.

The molding compound can be a first molding compound, and the method can include coupling at least one power tab with the second side of the substrate. The method can include transfer molding the assembly to encapsulate, with a second molding compound, the plurality of semiconductor die, the proximal end portion of at least one signal pin, at least a portion of the substrate, a portion of the at least one power tab, and a portion of the first molding compound, such that a surface of the first molding compound is coplanar with a surface of the second molding compound.

In another general aspect, an electronic device assembly includes a thermal-dissipation appliance, and a substrate arranged in a plane. The substrate has a first side coupled with the thermal-dissipation appliance, and a second side that is opposite the first side. The assembly further includes a plurality of semiconductor die are disposed on the second side of the substrate, and a plurality of signal pins coupled with the second side of the substrate. Each signal pin of the plurality of signal pins includes a proximal end portion coupled with the second side of the substrate, a distal end portion; and a medial portion disposed between the proximal end portion and the distal end portion. The medial portion is pre-molded in a molding compound. The proximal end portion and the distal end portion exclude the molding compound. Each signal pin of the plurality of signal pins is arranged along a respective longitudinal axis that is orthogonal to the plane of the substrate.

Implementations can include one or more of the following features, alone or in combination. For example, the molding compound can be a first molding compound. The assembly can further include at least one power tab coupled with the second side of the substrate. The assembly can include a second molding compound encapsulating a portion of the at least one power tab, the plurality of semiconductor die, respective proximal end portions of the plurality of signal pins, at least a portion of the substrate, and respective portions of the first molding compound of the plurality of signal pins, such that respective surfaces of the first molding compound of the plurality of signal pins are coplanar with a surface of the second molding compound.

A surface of the at least one power tab can be exposed through the surface of the second molding compound. The at least one power tab can be coupled with the substrate via a post.

The surface of the second molding compound can be a first surface of the second molding compound, and the portion of the at least one power tab is a first portion. A second portion of the at least one power tab can be disposed outside the second molding compound. The second portion of the at least one power tab can extend out of the second molding compound at a second surface of the second molding compound. The second surface of the second molding compound can be non-parallel with the first surface of the second molding compound.

BRIEF DESCRIPTION OF THE DRAWINGS

FIGS. 1A to 1C are diagrams illustrating various views of an example partially pre-molded signal pin that can be included in a semiconductor device module.

FIGS. 2A to 2C are diagrams illustrating various views of another example partially pre-molded signal pin that can be included in a semiconductor device module.

Figure 3A:
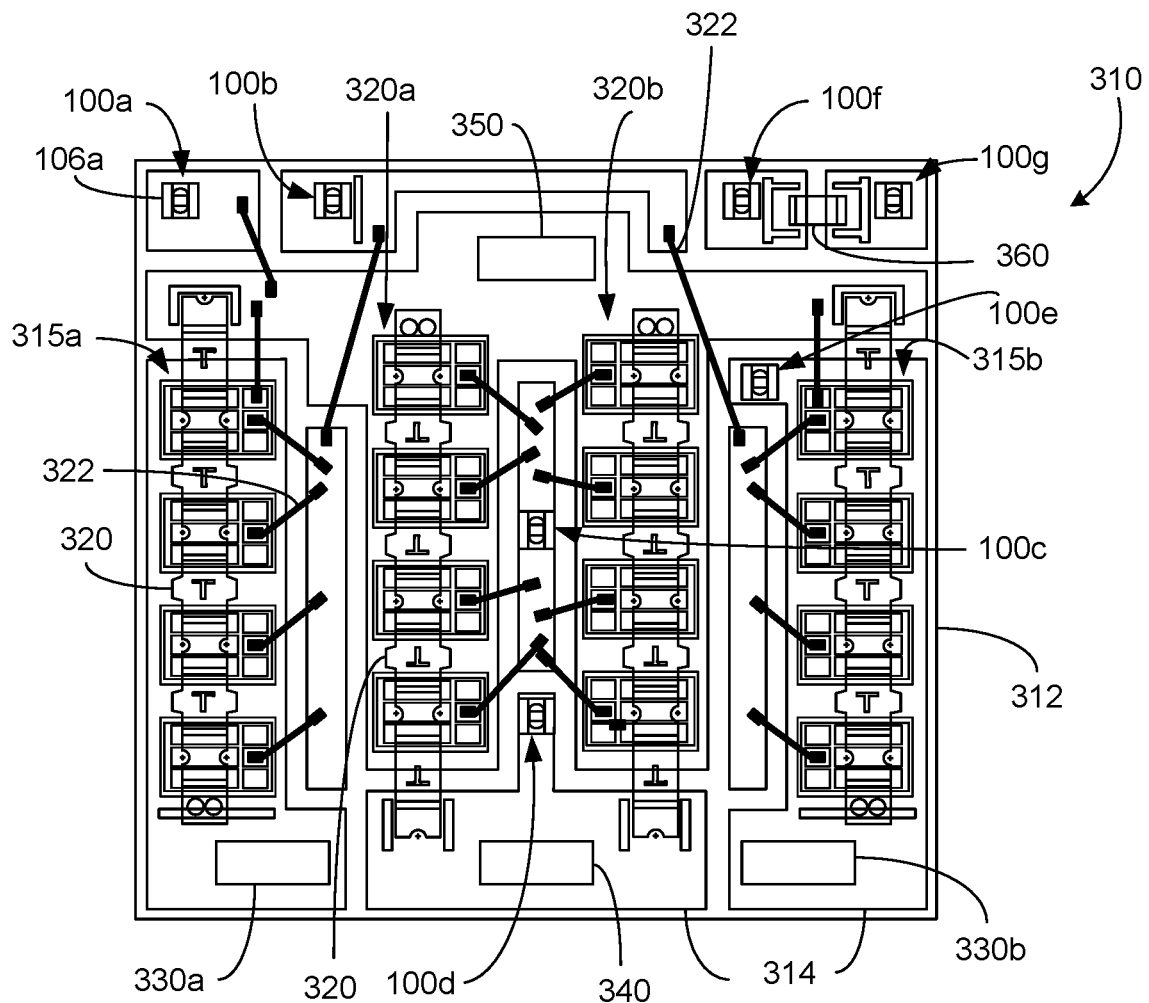
FIGS. 3A to 3F are diagrams of an example semiconductor device module and components thereof.

Like reference symbols in the various drawings indicate like elements. Reference numbers for some like elements may not be repeated for all such elements. In certain instances, different reference numbers may be used for like, or similar elements. Some reference numbers for certain elements of a given implementation may not be repeated in each drawing corresponding with that implementation. Some reference numbers for certain elements of a given implementation may be repeated in other drawings corresponding with that implementation, but may not be specifically discussed with reference to each corresponding drawing. The drawings are for purposes of illustrating example implementations and may not necessarily be to scale.

DETAILED DESCRIPTION

This disclosure relates to packaged semiconductor device apparatuses, which can be referred to as modules, assemblies, semiconductor device modules, power semiconductor device modules, etc., as well as associated methods for producing such apparatuses The approaches illustrated and described herein can be used to implement semiconductor device modules (e.g., half-bridge power modules in the example implementations described herein) that can overcome at least some of the drawbacks of prior approaches discussed above. While the approaches described here are generally described for half-bridge power modules, in some implementations semiconductor device modules implementing other circuits are possible, such as, for instance, a full-bridge power module, a 3-phase half-bridge module, a multi-phase half-bridge module, etc.

In the implementations described herein, signal pins and/or power tabs can be arranged on a primary surface of a semiconductor device module, rather than along an edge of the module. Such approaches eliminate the use of bent signal pins, reducing the risk of deformation and/or breaking of the signal pins. Further, sufficient signal pin spacing for electrical isolation in the disclosed approaches can be achieved with reduced overall module (package) dimensions, as compared to prior approaches with signal pins arranged along an edge of a corresponding module. Such reductions in module dimensions can, accordingly, help prevent issues, such as those described above, related to attachment of a module with a thermal-dissipation appliance. Also, because the signal pins and power tabs are not formed using a single body stamping operation, they can include, e.g., be produced from, materials with superior electrical and thermal properties (e.g., copper) than materials used in prior approaches implemented using a single body stamped leadframe.

Further, in implementations described herein, a substrate (e.g., a direct-bonded metal (DBM) substrate) can be attached to a thermal-dissipation appliance as a first operation of an assembly process for the module. Such approaches can further help prevent issues associated with attachment of a module with a thermal-dissipation appliance (e.g., adhesive thickness, adhesive voids, and/or solder re-melt).

FIGS. 1A to 1C are diagrams illustrating various views of an example partially pre-molded signal pin 100 that can be included in a semiconductor device module, such as the example implementations described herein. Specifically, FIG. 1A illustrates an isometric view of the partially pre-molded signal pin 100, FIG. 1B illustrates a front view of the partially pre-molded signal pin 100, and FIG. 1C illustrates a side view of the partially pre-molded signal pin 100. As shown in FIGS. 1A to 1C, the partially pre-molded signal pin 100 includes a proximal end portion 102, a distal end portion 104, and a medial portion 106.

In this example, the proximal end portion 102 includes a spring portion 102a, a spring portion 102b, a foot 102c and a mechanical stop portion 102d. The spring portion 102a and the spring portion 102b are curved or S-shaped, which can reduce mechanical stresses associated with attachment of the partially pre-molded signal pin 100 to a corresponding module (e.g., a substrate of a semiconductor device module), as well as reduce stresses associated with thermal cycling of an associated module during operation and/or during reliability testing. As shown in FIGS. 1A to 1C, the foot 102c is included in, or formed as part of the spring portion 102a and the spring portion 102b. That is, the foot 102c is common to the spring portion 102a and the spring portion 102b.

A bottom surface of the foot 102c (in the views of FIGS. 1A to 1C) can be used to attach (couple, solder, sinter, etc.) the proximal end portion 102 of the partially pre-molded signal pin 100 to a contact surface of a module, such as a metal pad or metal layer included on a surface of a substrate. An upper surface of the foot (in the views of FIGS. 1A to 1C) can interface with the mechanical stop portion 102d to limit compression of the spring portion 102a and the spring portion 102b, such as during attachment of the partially pre-molded signal pin 100 in a module. For instance, as shown in FIG. 1C, when the spring portion 102a and the spring portion 102b are uncompressed, there is a space of distance S between the mechanical stop portion 102d and the upper surface of the foot 102c. As also shown in FIG. 2C, the partially pre-molded signal pin 100 can be arranged along a longitudinal axis L. In this example, when the spring portion 102a and the spring portion 102b are vertically compressed by the distance S along the longitudinal axis L, the mechanical stop portion 102d will contact the upper surface of the foot 102c, helping to prevent over compression of the spring portion 102a and the portion spring portion 102b.

In the example of FIGS. 1A to 1C, the distal end portion 104 is configured for press-fit insertion in, for example, a printed circuit board. Further in the example of FIGS. 1A to 1C, the medial portion 106, which is disposed between the proximal end portion 102 and the distal end portion 104, includes a molding compound 106a that encapsulates a portion of the signal pin (e.g., a portion between the proximal end portion 102 and the distal end portion 104). As shown in FIGS. 1A to 1C, the proximal end portion 102 and the distal end portion 104 exclude the molding compound 106a.

FIGS. 2A to 2C are diagrams illustrating various views of another example partially pre-molded signal pin 200 that can be included in a semiconductor device module. As with the partially pre-molded signal pin 100, the partially pre-molded signal pin 200 includes a proximal end portion 202, a distal end portion 204 and a medial portion 206. In this example, the proximal end portion 202 and the medial portion 206 are respectively consistent with the proximal end portion 102 and the medial portion 106 of the partially pre-molded signal pin 100. Accordingly, for purposes of brevity, details of the proximal end portion 102 and the medial portion 106 discussed above will not be described again with respect to the proximal end portion 202 and the medial portion 206 of the partially pre-molded signal pin 200 shown in FIGS. 2A to 2C.

As compared to the distal end portion 104 of the partially pre-molded signal pin 100, the distal end portion 204 of the partially pre-molded signal pin 200 includes a straight pin portion that is configured for solder connection in, e.g., a PCB, rather the press-fit pin portion of the distal end portion 104. It is noted that the example arrangements of the partially pre-molded signal pin 100 and the partially pre-molded signal pin 200 are given by way of example, and other configurations for partially pre-molded signal pins are possible.

FIGS. 3A to 3F are diagrams of an example semiconductor device module and components thereof. FIGS. 3A to 3F are generally described, by way of example and for purposes of illustration, with respect to a module 300 implementing a half-bridge circuit. In other implementations, other circuits can be implemented. Further, the example of FIGS. 3A-3F is described as including signal pins that are similar to the partially pre-molded signal pin 100 of FIGS. 1A-1C. In other implementations, other partially pre-molded signal pins could be used, such the partially pre-molded signal pin 200, for example. In some implementations, a combination of partially pre-molded signal pins with different configurations can included in a module.

Figure 3B:
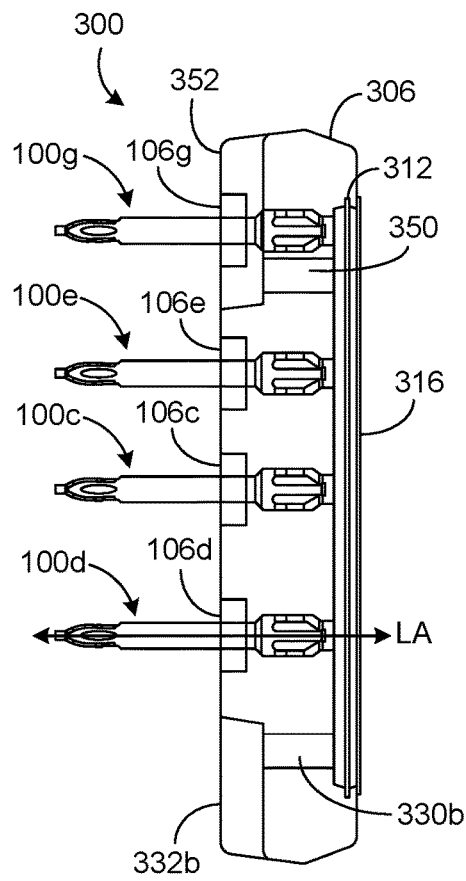
Figure 3C:
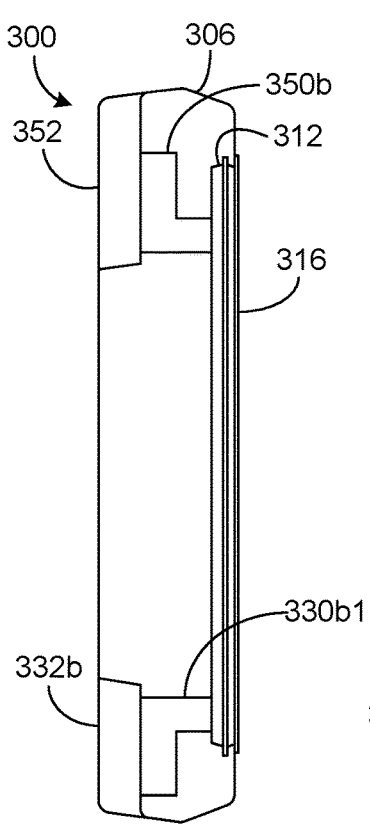
Figure 3D:
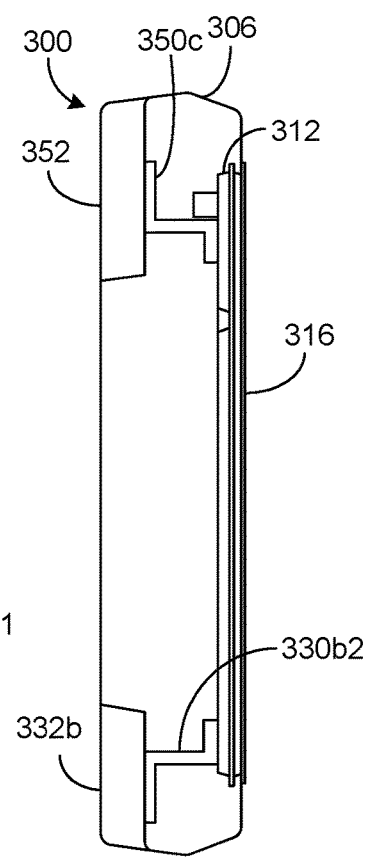
Figure 3F:
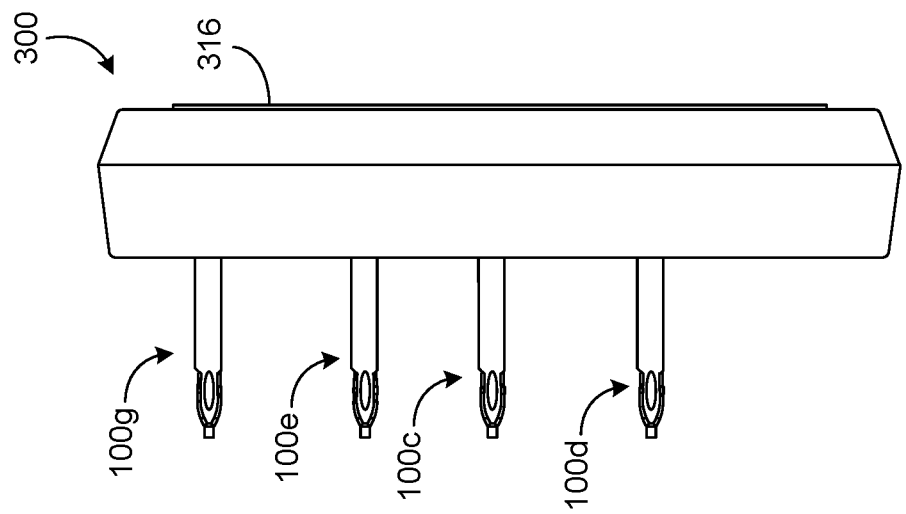
Figure 3E:
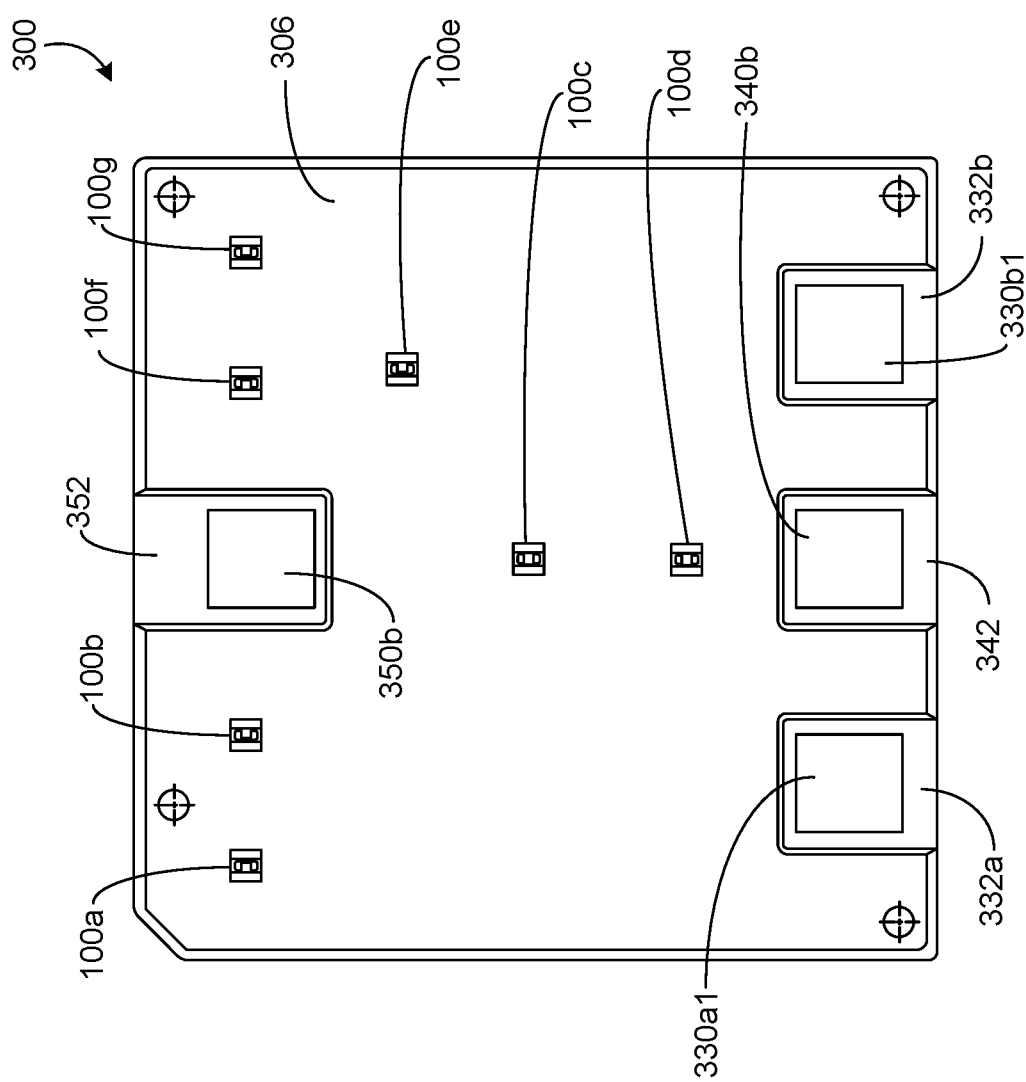

FIG. 3A is diagram illustrating a substrate assembly 310 implementing a half-bridge circuit. The substrate assembly 310 in FIG. 3A is shown after attachment of partially pre-molded signal pins a substrate 312, but prior to attachment of power tabs and transfer molding. FIGS. 3B-3D are diagrams that schematically illustrate various configurations for coupling power tabs to a substrate, such as the substrate 312. FIG. 3B also schematically illustrates an example arrangement of partially pre-molded signal pins in a module (e.g., after transfer molding of the module), e.g., partially pre-molded signal pins of the substrate assembly 310 shown in FIG. 3A. FIG. 3E is a diagram illustrating a module 300 including partially pre-molded signal pins after power tab attachment and transfer molding, where the module 300 can be implemented using the substrate assembly 310 of FIG. 3A. FIG. 3F is a diagram illustrating a side view of the module 300.

In FIG. 3A, a first side of the substrate 312. The substrate 312 can be a DBM substrate, such as direct-bonded copper (DBC) substrate. As shown in FIG. 3A, the illustrated side of the substrate 312 includes a patterned metal layer 314 for implementing the half-bridge circuit. Two portions of the patterned metal layer 314 are indicated in FIG. 3A, though the patterned metal layer 314 includes additional portions. A plurality of semiconductor die are disposed on respective portion of the patterned metal layer 314. For instance, the substrate assembly 310 includes a first column 315a of high-side switches (e.g., power transistors), a second column 315b of high-side switches, a first column 320a of low-side switches, and a second column 320b of low-side switches. The high-side switches of the first column 315a and the second column 315b are electrically coupled in parallel with each other, e.g., to functionally operate as a single high-side switch. Likewise, the low-side switches of the first column 320a and the second column 320b are electrically coupled in parallel with each other, e.g., to functionally operate as a single low-side switch. The high-side switches and low-switches in the substrate assembly 310 are electrically connected to implement a half-bridge circuit using the patterned metal layer 314, conductive clips 320 and wire bonds 322. It is noted that every conductive clip and wire bond are not specifically referenced in FIG. 3A.

As shown in FIG. 3A, the substrate assembly 310 also includes a post 330a and a post 330b. In this implementation, respective positive (V+) power supply tabs can be coupled with the post 330a and the post 330b. The substrate assembly 310 further includes a post 340, to which a negative (V−) power tab can be coupled in this example. Additionally, the substrate assembly 310 includes a post 350, to which an output power tab can be coupled. FIG. 3A illustrates an example post configuration, e.g., columnar posts. In some implementations, posts for electrically coupling power tabs to the substrate assembly 310 can have other configurations or arrangements, such as those shown in FIGS. 3C and 3D.

The substrate assembly 310 of FIG. 3A further includes a number of partially pre-molded signal pins that are coupled with the patterned metal layer 314 of the substrate 312 for use in operation of the corresponding half-bridge circuit. For instance, the substrate assembly 310 includes a partially pre-molded signal pin 100a that can be used for a high-side source sense signal of the half-bridge circuit. As shown in FIG. 3A, the partially pre-molded signal pin 100a includes the (pre-molded) molding compound 106a (as with the partially pre-molded signal pin 100). The substrate assembly 310 also includes a partially pre-molded signal pin 100b that can be used for a high-side switch gate control signal, a partially pre-molded signal pin 100c that can be used for a low-side switch gate control signal, a partially pre-molded signal pin 100d that can be used for a low-side source sense signal, and a partially pre-molded signal pin 100e that can be used for a positive power supply sense signal. The substrate assembly 310 further includes a partially pre-molded signal pin 100f and a partially pre-molded signal pin 100g, which can be used for thermal sensing using a thermistor 360 that is electrically coupled between the partially pre-molded signal pin 100f and the partially pre-molded signal pin 100g. While each of the partially pre-molded signal pins of the substrate assembly 310 includes a pre-molded molding compound (such as the medial portion 106 of the partially pre-molded signal pin 100), for purposes of brevity and clarity, the respective pre-molded molding compound for each of the partially pre-molded signal pins is not specifically referenced, or individually described here.

FIG. 3B is a diagram that schematically illustrates a side view of a module 300, which can include the substrate assembly 310 of FIG. 3A after attachment of power tabs and transfer molding in a molding compound 306. In this example, transfer molding can encapsulate the elements of the half bridge circuit (e.g., the plurality of semiconductor die, the wire bonds, the conductive clips, the proximal ends of the partially pre-molded signal pins, a portion of the substrate, portions of the power tabs, and portions of the medial portions of the partially pre-molded signal pins). In the view of FIG. 3B, as well as the views of FIGS. 3C and 3D, elements of the half-bridge circuit included on the substrate 312 in FIG. 3A are omitted for purposes of clarity. Further in the views of FIG. 3B to 3D, some elements of the module 300 internal to the molding compound 306 are shown for purposes of reference, though those elements may not be visible in an actual implementation. That is, in FIGS. 3B-3D, the molding compound 306 is illustrated as being transparent.

As shown in FIG. 3B, a positive supply power tab 332b can be coupled with the substrate 312 via the post 330b, and an output power tab 352 can be coupled with the substrate 312 via the post 350. In this view, additional power tabs (e.g., a negative power supply tab and a second positive power supply tab) and their associated posts are disposed behind the positive supply power tab 332b and the post 330b, and, therefore, not shown in FIG. 3B. In some implementations, the power tabs can be coupled with their respective posts, and the posts coupled with the substrate 312 using soldering, sintering, etc. As illustrated in FIG. 3B for the partially pre-molded signal pin 100d, each of the partially pre-molded signal pins can extend along a longitudinal axis LA, where the longitudinal axis LA is orthogonal to a plane defined by the surface of the substrate 312 on which the half-bridge circuit is implemented.

As further shown in FIG. 3B, the partially pre-molded signal pin 100c, the partially pre-molded signal pin 100d, the partially pre-molded signal pin 100e and the partially pre-molded signal pin 100g are illustrated, where respective proximal end portions (e.g., feet) of the pre-molded signal pins are coupled with (e.g., soldered or sintered to) the substrate 312. In this view, the partially pre-molded signal pin 100a, the partially pre-molded signal pin 100b and the partially pre-molded signal pin 100f are disposed behind the partially pre-molded signal pin 100g and, therefore, not shown in FIG. 3B.

Further in FIG. 3B, molding compound 106c, molding compound 106d, molding compound 106e, and molding compound 106g of the respective partially pre-molded signal pins 100c, 100d, 100e and 100g are illustrated. As shown in FIG. 3, the molding compound of the partially pre-molded signal pins is partially encapsulated in the molding compound 306 (from transfer molding of the module 300), such that respective exposed surfaces of the molding compound of each of the partially pre-molded signal pins is coplanar with an exposed surface of the molding compound 306. In this example, the molding compound of the other partially pre-molded signal pins (not shown in FIG. 3B) can be similarly arranged with the molding compound 306.

FIG. 3B (as well as FIGS. 3C and 3D) also illustrates a metal layer 316 that can be disposed on a side of the substrate 312 that is opposite the side of the substrate 312 illustrated in FIG. 3A. The metal layer 316 can, in some implementations, be coupled (soldered, sintered, etc.) with a thermal-dissipation appliance. For instance, the metal layer 316 can be a direct-bonded metal layer of the substrate 312.

FIGS. 3C and 3D are diagrams that schematically illustrate alternative configurations of posts used to couple power tabs of the module 300 to the substrate 312. As compared to FIG. 3B, in addition to the elements of the half-bridge circuit included on the substrate 312 in FIG. 3A being omitted, the partially pre-molded signal pins are also omitted in FIGS. 3C and 3D. As shown in FIG. 3C, as compared to FIG. 3B, L-shaped posts 330b1 and 350b are used, respectively, instead of the columnar posts 330b and 350. The other posts of the module 300 can also be implemented as L-shaped posts. As shown in FIG. 3D, as compared to FIG. 3A, step-shaped posts 330b2 and 350c are used, respectively, instead of the columnar posts 330b and 350. Again, the other posts of the module 300 can also be implemented as step-shaped posts. In some implementations, a combination of post shapes can be used for coupling power tabs with a corresponding substrate.

FIG. 3E illustrates an example implementation of the module 300 after attachment of power tabs to L-shaped posts (such as the posts shown in FIG. 3C) and transfer molding. As noted above, the module 300 can be implemented using the substrate assembly 310 of FIG. 3A (using L-shaped posts in place of columnar posts). In the view of FIG. 3E, respective attachments surfaces for the power tabs are shown for purposes of reference. In an actual implementation, the attachments surfaces would not be visible through the power tabs. In the example of FIG. 3E, a positive power tab 332a is coupled with a post 330a1, and a negative power tab 342 is coupled with a post 340b. Also, as was shown in FIG. 3B, in FIG. 3E the positive supply power tab 332b is coupled with the post 330b1, and the output power tab 352 is coupled with the post 350b. In this example, surfaces (e.g., contact surfaces) of the power tabs can be exposed through the molding compound. Such an arrangement reduces a current path distance (between the positive supply power tabs and the negative power supply tab) as compared to prior approaches. For instance, as shown in FIGS. 3B-3D, the contact surfaces of the power tabs can be coplanar with an exposed surface of the molding compound 306, e.g., on the left side of each of the views in FIGS. 3B-3D. Such an arrangement reduces a current path distance (between the positive supply power tabs and the negative power supply tab) as compared to prior approaches. Accordingly, the module 300 can operate with lower stray inductance (e.g., 50 percent less stray inductance) than prior approaches.

FIG. 3E further illustrates the arrangement of the partially pre-molded signal pins 100a to 100g (and their respective pre-molded portions) over the surface of the molding compound 306, where that surface can be referred to as a primary surface or principal surface (e.g., rather than an edge surface). In some implementations, other arrangements of partially pre-molded signal pins are possible, and will depend on the particular implementation. For instance, additional or fewer partially pre-molded signal pins could be included, and/or the partially pre-molded signal pins could be differently arranged, e.g., depending on an arrangement of a corresponding substrate and/or a circuit implemented.

FIG. 3F illustrates a side view of the module 300 of FIG. 3E. In this view, respective distal end portions of the partially pre-molded signal pins 100c, 100d, 100e and 100g are shown. As distal end portions of the partially pre-molded signal pins 100a, 100b and 100f are behind the distal end portion of the partially pre-molded signal pin 100g in this view, they are not shown in FIG. 3F.

FIGS. 4A to 4D are diagrams of another example semiconductor device module 400 and components thereof. In this example, the module 400 includes a substrate assembly 410. In this example, the substrate assembly 410 can be a same substrate assembly as the substrate assembly 310 of FIG. 3A with the posts 330a, 330b, 340 and 350 omitted. Accordingly, for purposes of brevity, the details of the substrate assembly 410 discussed with respect to the substrate assembly 310 will not be discussed again here. As compared to the module 300 of FIGS. 3A-3F, the module 400 includes power tabs that are directly coupled to the substrate assembly (rather than via corresponding posts as in the module 300). For instance, in some implementations, the power tabs of the module 400 can be coupled with a substrate of the substrate assembly 410 via direct-lead attachment.

Figure 4B:
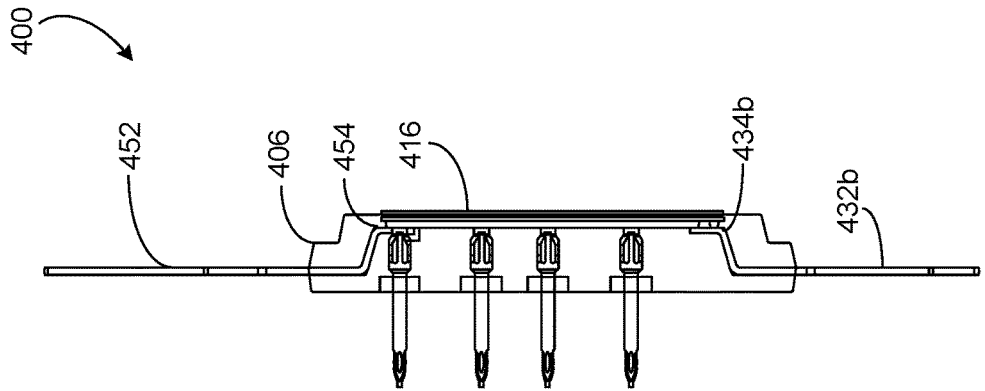
FIGS. 4A to 4D are diagrams of another example semiconductor device module and components thereof.
Figure 4A:
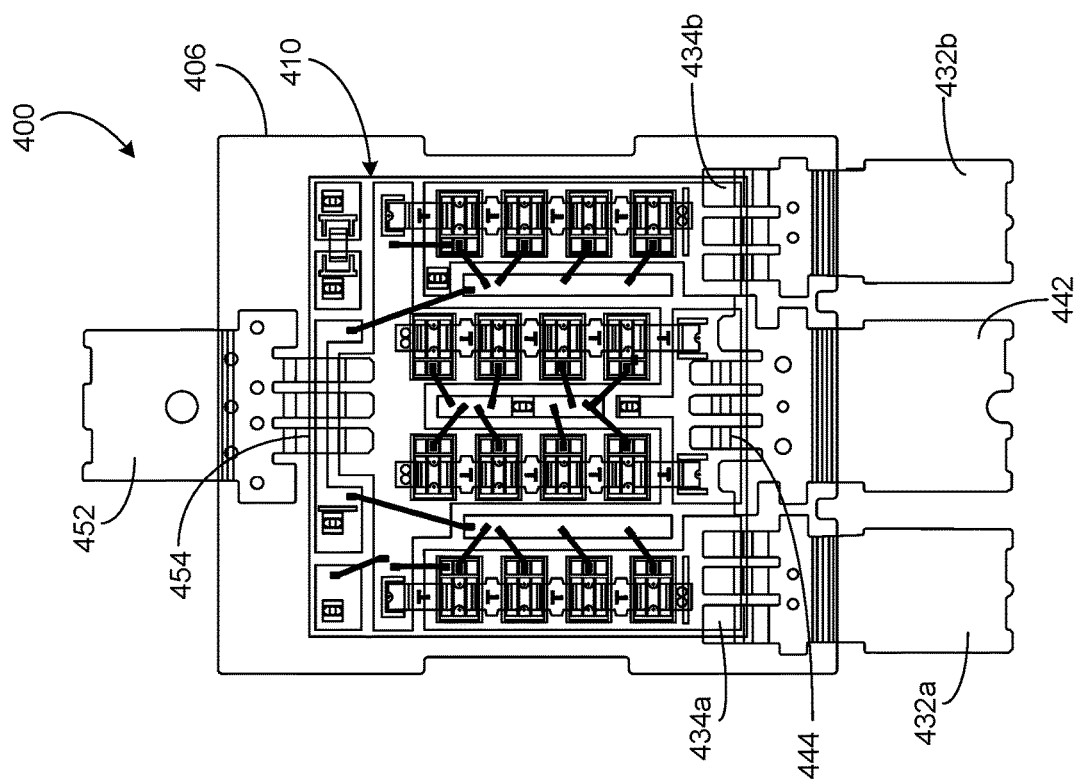

As shown in FIG. 4A, the module 400 includes a positive supply power tab 432a, a positive supply power tab 432b, a negative supply power tab 442, and an output power tab 452. Each of the power tabs includes a respective plurality of attachment leads 434a, 434b, 444 and 454, which can be formed by bending corresponding portions of the power tabs using a stamping process. In this example, the respective attachment leads of each power tab are coupled to respective portions of a patterned metal layer of the corresponding substrate. The module 400, as shown in FIG. 4A, further includes a molding compound 406 (formed using transfer molding) to encapsulate, wholly or partially, various elements of the module 400. For instance, the molding compound 406 can encapsulate elements of the module 400 similar to elements of the module 300 encapsulated by the molding compound 306, as was described above. Further, in the module 400, the molding compound 406 can encapsulate portions of the power tabs, e.g., respective portions including the attachment legs, while other portions of the power tabs are disposed outside the molding compound 406.

FIG. 4B is a diagram that schematically illustrates a side view of the module 400 of FIG. 4A. As with the view of the module 300 in FIG. 3B, in the view of the module 400 in FIG. 4B, elements of the half-bridge circuit included on the substrate of the substrate assembly 410 in FIG. 4A are omitted. Further in the view of FIG. 4B, some elements of the module 400 internal to the molding compound 406 are shown for purposes of reference, though those elements may not be visible in an actual implementation. That is, in FIG. 4B, the molding compound 406 is illustrated as being transparent. Further, a like arrangement of partially pre-molded signal pins as shown in FIG. 3B is shown in FIG. 4B. The specific details of that arrangement of partially pre-molded signal pins is not described again here with respect to FIG. 4B. As with the metal layer 316 of the module 300, the module 400 can include a metal layer 416 (e.g., a metal layer of a corresponding DBM substrate) that is exposed through the molding compound 406, such as for attachment of the module 400 to a thermal dissipation appliance.

In this example, as shown in FIG. 4B. the respective portions of the positive supply power tab 432b and the output power tab 452 that are disposed outside the molding compound extend out of a surface of the molding compound 406 that is non-parallel with a surface on which the partially pre-molded signal pins are arranged. That is, the external portions of the positive supply power tab 432b and the output power tab 452 extend out of respective edge surfaces of the molding compound 406.

Figure 4D:
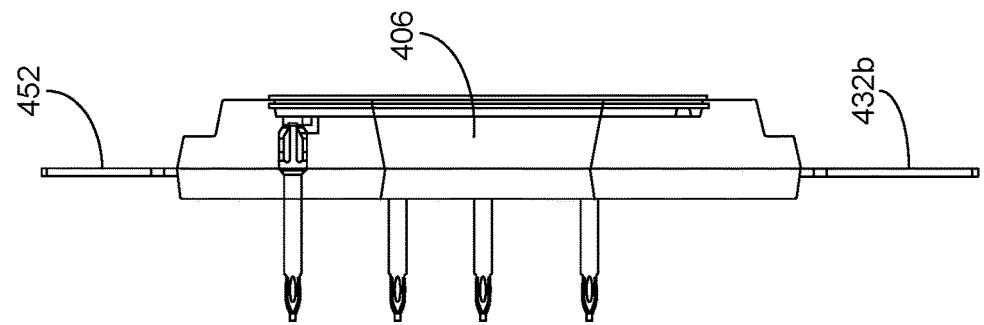
Figure 4C:
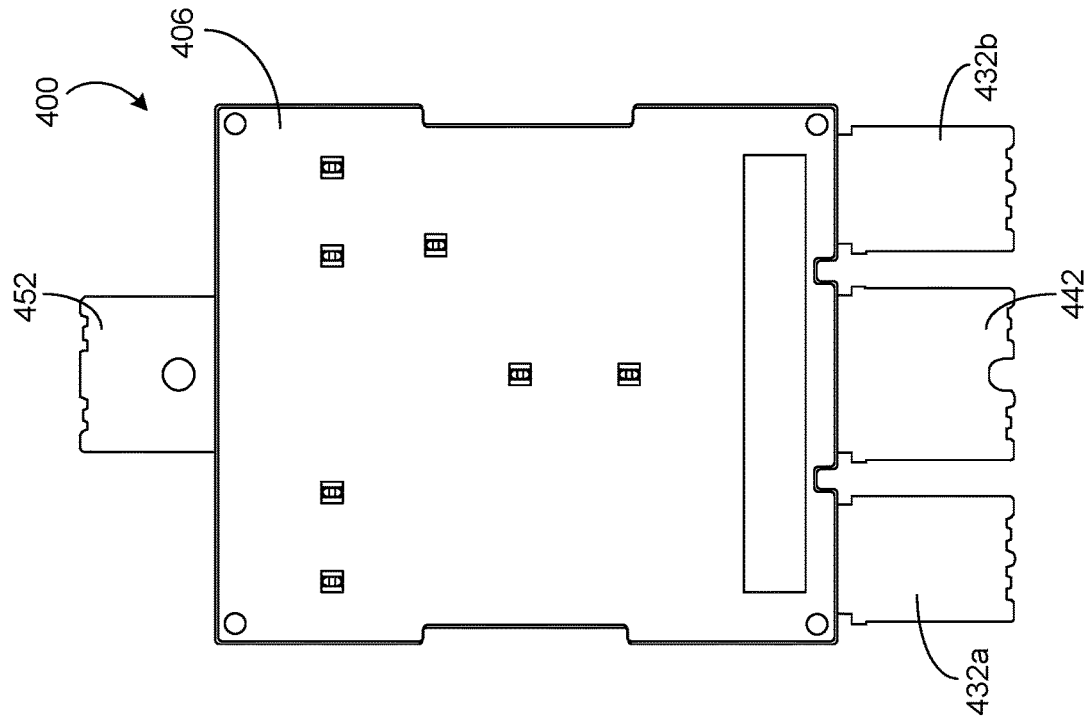

FIG. 4C further illustrates the arrangement of partially pre-molded signal pins of the module 400 (and their respective pre-molded portions) over a primary surface of the molding compound 406, such as the arrangement of partially pre-molded signal pins of the module 300 illustrated in FIG. 3E. As with the module 300, in some implementations, other arrangements of partially pre-molded signal pins in the module 400 are possible, and will depend on the particular implementation. For instance, additional or fewer partially pre-molded signal pins could be included, and/or the partially pre-molded signal pins could be differently arranged, e.g., depending on an arrangement of a corresponding substrate and/or a circuit implemented.

FIG. 4D illustrates a side view of the module 400 of FIG. 4C similar to the view of FIG. 4B, with the molding compound 406 illustrated as being opaque, as in an actual implementation. That is, elements of the module 400 internal to the molding compound 406 shown in FIG. 4B are obscured (not visible) in the view of FIG. 4D.

Figure 5:
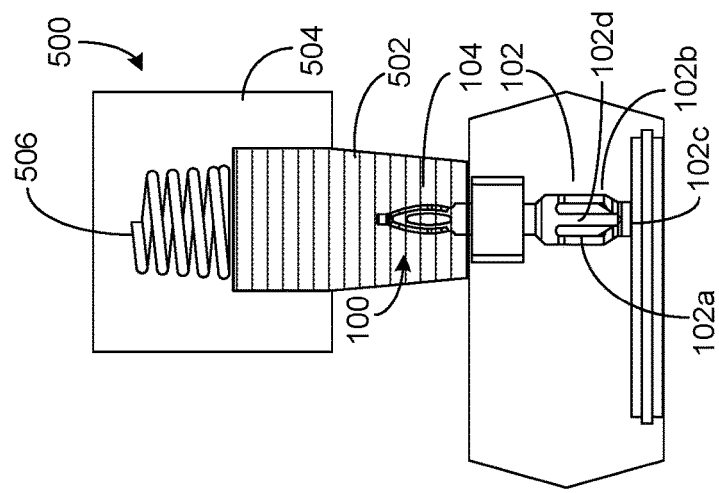
FIG. 5 is diagram schematically illustrating an example approach for coupling a partially pre-molded signal pin, such as the signal pins of FIGS. 1A to 1C and FIGS. 2A to 2C with a contact surface.

FIG. 5 is a diagram that schematically illustrates an approach for coupling a partially pre-molded signal pin to a contact surface, such as surface of a substrate of a semiconductor device module, as in the example implementations described herein. For purposes of discussion, attachment of an implementation of the partially pre-molded signal pin 100 is described, though the approach of FIG. 5 can be used for other partially pre-molded signal pin implementations, such as for the partially pre-molded signal pin 200.

In the example of FIG. 5, a leveling tool 500 is used, where the leveling tool 500 includes a support structure 502 in which the distal end portion 104 of the pin can be secured, such as by surface friction, during attachment. The support structure 502 can be movably disposed within a housing 504 that includes a spring 506 that, by compression and expansion, controls upward and downward movement of the support structure 502 and, as a result, upward and downward movement of the partially pre-molded signal pin 100 within the support structure 502. While secured in the support structure 502 of the leveling tool 500, the foot 102c of the proximal end portion 102 of the partially pre-molded signal pin 100 can be positioned on the surface to which it is to be coupled, such as a metal layer. Prior to positioning the partially pre-molded signal pin 100, solder can be applied to the metal layer and/or the lower surface of the foot 102c.

In such an approach, the spring 506 of the leveling tool 500, in cooperation with the spring portion 102a and the spring portion 102b of the proximal end portion 102 of the 100 can establish (determine, etc.) a desired vertical positioning of the partially pre-molded signal pin 100. Further, the mechanical stop portion 102d of the proximal end portion 102 can prevent over compression of the spring portion 102a and the spring portion 102b. After the desired vertical position is established, a solder reflow operation can be performed to fixedly couple the foot 102c of the proximal end portion 102 to the contact surface (e.g., a portion of a patterned metal layer of a substrate). After the solder reflow operation, the leveling tool 500 can be removed, with the 100 fixedly coupled to its desired contact surface.

Figure 6C:
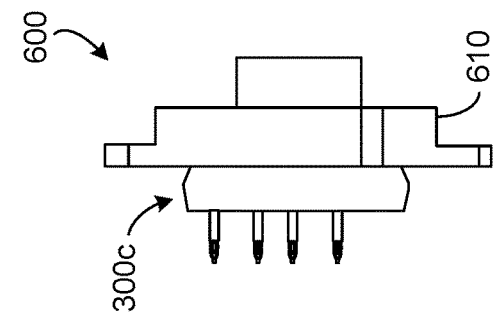
FIGS. 6A to 6C are diagrams illustrating various views of an example semiconductor device assembly.
Figure 6A:
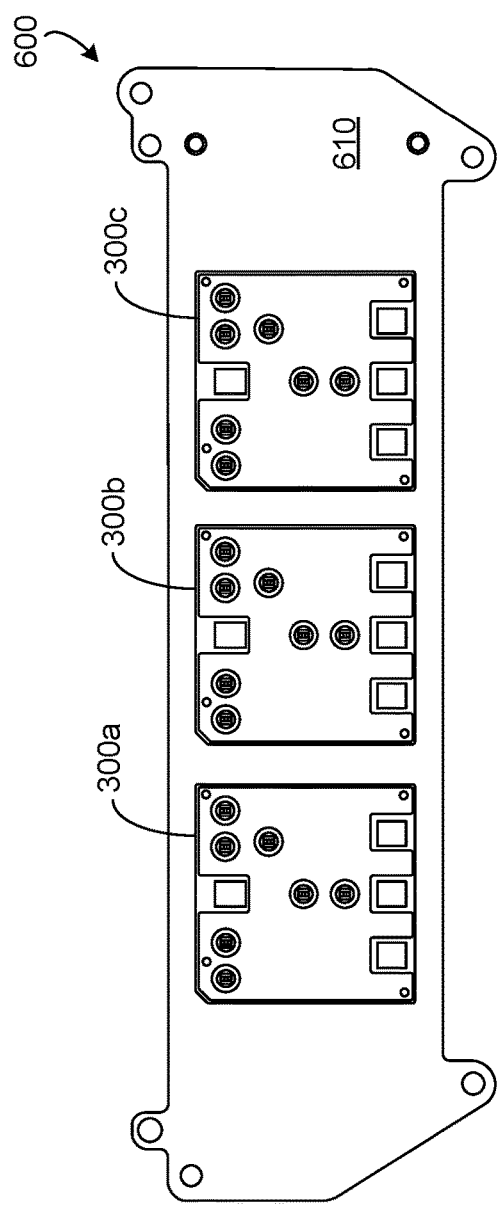
Figure 6B:
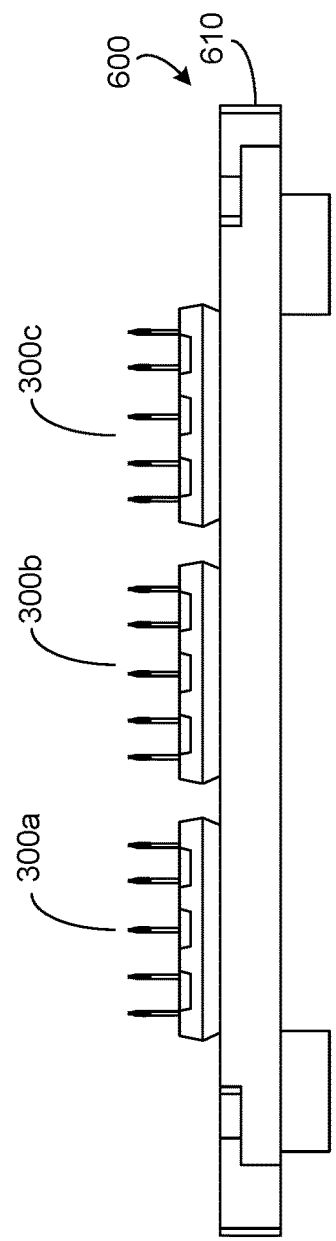

FIGS. 6A to 6C are diagrams illustrating various views of an example semiconductor device assembly 600. The semiconductor device assembly 600 includes a thermal-dissipation appliance 610, which can be a heat sink, a cooling jacket, etc. Specifically, FIG. 6A shows a top-down view of the semiconductor device assembly 600, FIG. 6B shows side view of the semiconductor device assembly 600 looking toward the bottom edge of the semiconductor device assembly 600 in the view of FIG. 6A, and FIG. 6C shows side view of the semiconductor device assembly 600 looking toward the right edge of the semiconductor device assembly 600 in the view of FIG. 6A.

As shown in FIGS. 6A and 6B, the semiconductor device assembly 600 also includes three semiconductor device modules 300a, 300b and 300c that are disposed on a surface of the thermal-dissipation appliance 610. In this example, the modules 300a, 300b and 300c can be implementations of the module 300 of FIGS. 3A-3F. For instance, in some implementations, substrates of the modules 300a, 300b and 300c can be coupled with the thermal-dissipation appliance 610 as a first operation of a process for producing (assembling) the modules. In some implementations, other modules can be included in the semiconductor device assembly 600, such as implementations of the module 400. In the example of FIGS. 6A-6C, the respective substrates of each of the modules 300a, 300b and 300c can be attached to (coupled with, affixed to, etc.) the thermal-dissipation appliance 610 (by soldering, sintering, etc.) prior to other process operations used to assemble the modules, such as attaching semiconductor die, attaching conductive clips, forming wire bonds, attaching partially pre-molded signal pins, and/or transfer molding. Such an approach can help overcome issues related to attachment of fully assembled modules to a thermal-dissipation, such as adhesive layer inconsistency, adhesive voids, and damage to associated thermal and mechanical stresses. In the side view of FIG. 6C, the modules 300a and 300b are disposed behind the module 300c. Accordingly, only the module 300c is visible in FIG. 6C.

Figure 7C:
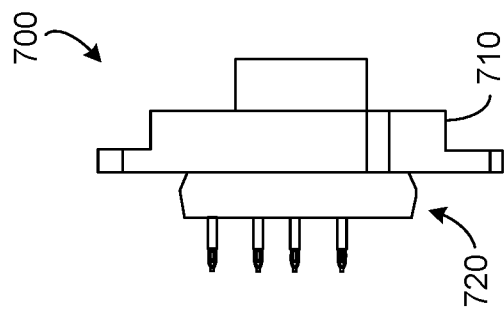
FIGS. 7A to 7C are diagrams illustrating various views of another example semiconductor device assembly.
Figure 7A:
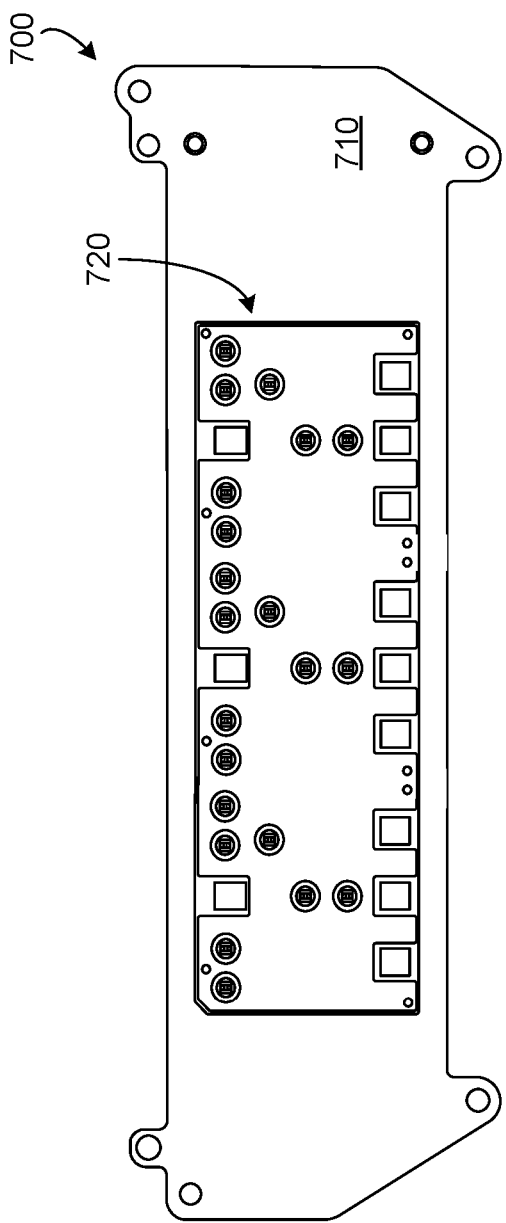
Figure 7B:
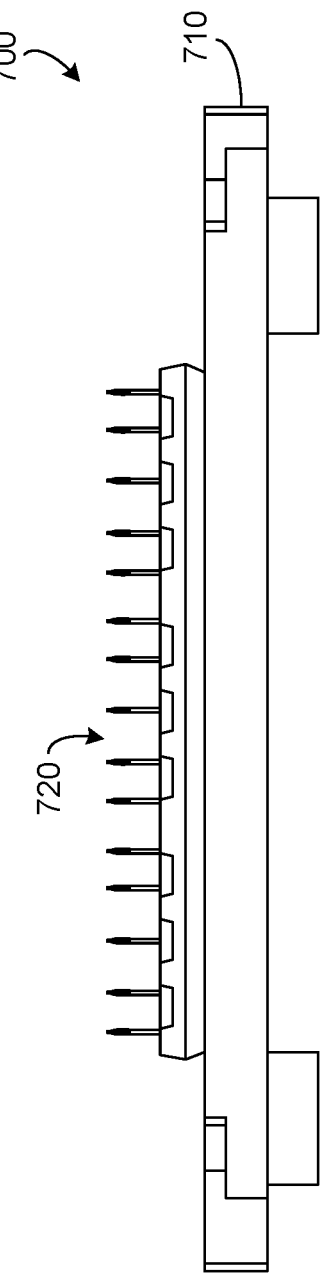

FIGS. 7A to 7C are diagrams illustrating various views of another example semiconductor device assembly 700. The semiconductor device assembly 700 includes a thermal-dissipation appliance 710, which can be a heat sink, a cooling jacket, etc. Specifically, as with FIGS. 6A-6c for the semiconductor device assembly 600, FIG. 7A shows a top-down view of the semiconductor device assembly 700, FIG. 7B shows side view of the semiconductor device assembly 700 looking toward the bottom edge of the semiconductor device assembly 700 in the view of FIG. 7A, and FIG. 7C shows side view of the semiconductor device assembly 700 looking toward the right edge of the semiconductor device assembly 700 in the view of FIG. 7A.

As with the semiconductor device assembly 600, in this example, the semiconductor device assembly 700 also includes three functionally independent half-bridge circuits. However, in comparison to the semiconductor device assembly 600, the semiconductor device assembly 700 includes a single transfer molded body 720, rather than three separate transfer molded bodies. In some implementations, the single transfer molded body 720 can include three substrate assemblies attached to the thermal-dissipation appliance 710 adjacent to one another, such as three instances of the substrate assembly 310 of FIG. 3. For instance, the three substrate assemblies can be directly adjacent to one another (e.g., in contact along corresponding edges), or can be adjacent to one another with respective spaces, e.g., of approximately 1 millimeter, in between the substrates, such as to account for substrate size variation and manufacturing tolerances. In other example implementations a single substrate can be used, with each of the separate half-bridge circuits being formed on the single substrate. As with the semiconductor device assembly 600, in some implementations, the substrate or substrates included in the single transfer molded body 720 can be coupled with the thermal-dissipation appliance 710 as a first operation of a process for producing (assembling) the single transfer molded body 720. After attachment of the substrate or substrates, other process operations used to produce the three half-bridge circuits can be performed, such as attaching semiconductor die, attaching conductive clips, forming wire bonds, attaching partially pre-molded signal pins, and/or transfer molding of the single transfer molded body 720. Such an approach can help overcome issues related to attachment of fully assembled modules to a thermal-dissipation, such as adhesive layer inconsistency, adhesive voids and damage to associated thermal and mechanical stresses.

Figure 8:
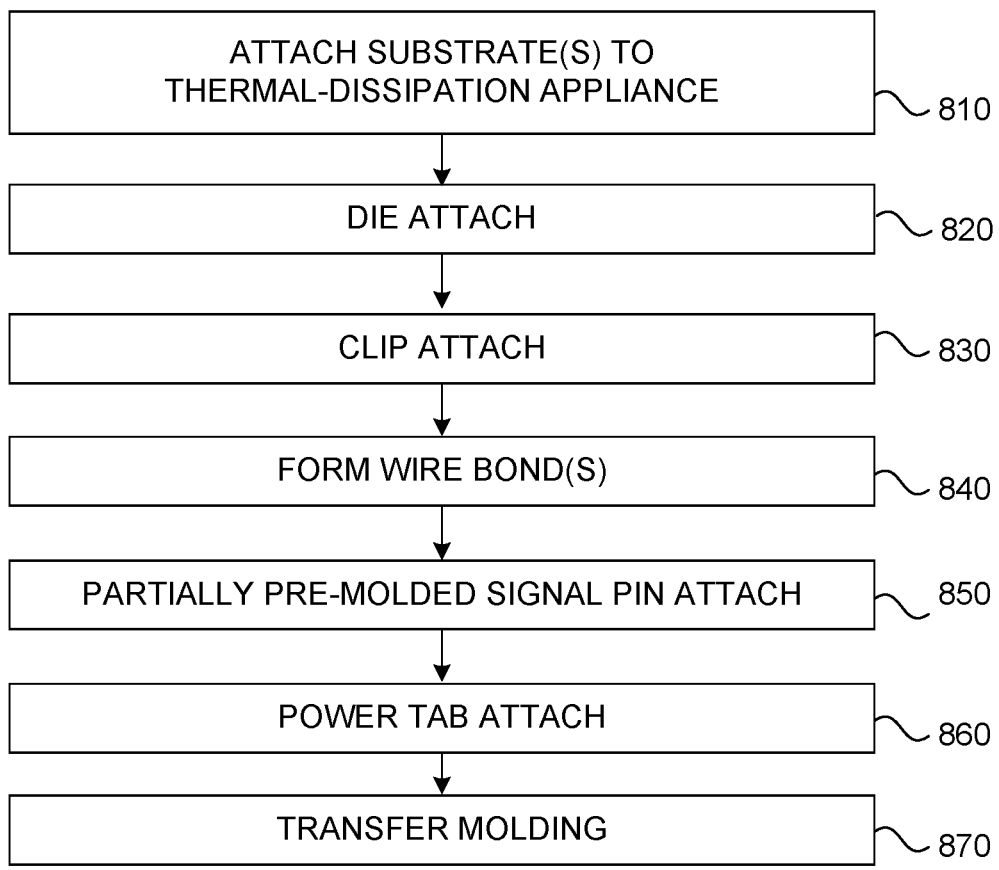
FIG. 8 is a flowchart illustrating an example method for producing a semiconductor device assembly.

FIG. 8 is a flowchart illustrating an example method 800 for producing a semiconductor device assembly using the techniques described herein, such as for producing the semiconductor device assembly 600 and/or the semiconductor device assembly 700. The method 800 includes, at block 810, attaching a substrate or multiple substrates to a thermal dissipation appliance. The operation at block 810 can include soldering, sintering, etc. At block 820, the method includes attaching semiconductor die to the substrate or substrate, such as semiconductor die including power transistors for implementing high-side and low-side switches of one or more half-bridge circuits. The attachment of the semiconductor die at block 820 can include soldering, using electrically conductive adhesive, etc. At block 830, the method 800 includes attaching (soldering, etc.) conduction clips to the semiconductor die, and the substrate(s), such as in the substrate assembly 310 of FIG. 3A. At block 840, the method includes forming wire bonds between the semiconductor die and the substrate(s), such as in the substrate assembly 310. At block 850, the method 800 includes attaching partially pre-molded signal pins, such as using the approach of FIG. 5.

At block 860, the method 800 includes attaching power tabs. In implementations of the module 300 (or similar implementations included in a single transfer molded body, attaching the power tabs can include attaching (soldering, etc.) the power tabs to respective posts included on the substrate(s), where such posts can be attached to the substrate(s) at a prior point of the method 800. In implementations of the module 400 (or similar implementations included in a single transfer molded body), attaching the power tabs can include attaching respective connection leads of the power tabs to the substrate(s) using direct-lead attach. At block 870, the method 800 includes performing a transfer molding process to form a single transfer molded body (as in the semiconductor device assembly 700) or multiple transfer molded bodies (as in the semiconductor device assembly 600).

It will be understood that, in the foregoing description, when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, top, bottom, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor device processing techniques associated with semiconductor substrates including, but not limited to, for example, silicon (Si), silicon carbide (SiC), gallium arsenide (GaAs), gallium nitride (GaN), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. An electronic device assembly comprising:
   a substrate arranged in a plane, the substrate having a first side and a second side, the second side being opposite the first side;
   a plurality of semiconductor die disposed on the first side of the substrate;
   at least one signal pin including:
      a proximal end portion coupled with the first side of the substrate;
      a distal end portion; and
      a medial portion disposed between the proximal end portion and the distal end portion, the medial portion being pre-molded in a molding compound,
      the proximal end portion and the distal end portion excluding the molding compound, and
      the at least one signal pin being arranged along a longitudinal axis that is orthogonal to the plane of the substrate.

2. The electronic device assembly of claim 1, wherein the proximal end portion of the at least one signal pin includes:
   a spring portion, the spring portion including a foot, the foot having a first surface coupled with the substrate and a second surface opposite the first surface; and
   a mechanical stop portion configured, during compression of the spring portion, to contact the second surface of the foot to limit the compression of the spring portion.

3. The electronic device assembly of claim 2, wherein the spring portion is a first spring portion, the proximal end portion of the at least one signal pin further including a second spring portion, the mechanical stop portion being disposed between the first spring portion and the second spring portion, and the foot being common with the first spring portion and the second spring portion.

4. The electronic device assembly of claim 1, wherein the at least one signal pin includes a plurality of signal pins respectively coupled with the first side of the substrate.

5. The electronic device assembly of claim 1, wherein the molding compound is a first molding compound, the electronic device assembly further comprising a second molding compound encapsulating:
 the plurality of semiconductor die;
 the proximal end portion of the at least one signal pin;
 at least a portion of the substrate; and
 a portion of the first molding compound, such that a surface of the first molding compound is coplanar with a surface of the second molding compound.

6. The electronic device assembly of claim 1, wherein the molding compound is a first molding compound, the electronic device assembly further comprising:
 at least one power tab coupled with the first side of the substrate; and
 a second molding compound encapsulating:
  the plurality of semiconductor die;
  the proximal end portion of at least one signal pin;
  at least a portion of the substrate;
  a portion of the first molding compound, such that a surface of the first molding compound is coplanar with a surface of the second molding compound; and
  a portion of the at least one power tab.

7. The electronic device assembly of claim 6, wherein a surface of the at least one power tab is exposed through the surface of the second molding compound.

8. The electronic device assembly of claim 7, wherein the at least one power tab is coupled with the substrate via a post.

9. The electronic device assembly of claim 8, wherein the post is one of:
 columnar;
 L-shaped; or
 step-shaped.

10. The electronic device assembly of claim 6, wherein:
 the surface of the second molding compound is a first surface of the second molding compound;
 the portion of the at least one power tab is a first portion; and
 a second portion of the at least one power tab is disposed outside the second molding compound, the second portion of the at least one power tab extending out of the second molding compound at a second surface of the second molding compound, the second surface of the second molding compound being non-parallel with the first surface of the second molding compound.

11. The electronic device assembly of claim 1, further comprising a thermal-dissipation appliance coupled with the second side of the substrate.

12. A method for producing an electronic device assembly, the method comprising:
 coupling a first side of a substrate with a thermal-dissipation appliance, the substrate being arranged in a plane; and
 after coupling the substrate with the thermal-dissipation appliance:
  coupling a plurality of semiconductor die with a second side of the substrate, the second side being opposite the first side;
  coupling at least one conductive clip with the second side of the substrate and at least one semiconductor die of the plurality of semiconductor die; and
  coupling at least one signal pin with the second side of the substrate, the at least one signal pin including:
   a proximal end portion coupled with the second side of the substrate;
   a distal end portion; and
   a medial portion disposed between the proximal end portion and the distal end portion, the medial portion being pre-molded in a molding compound, the proximal end portion and the distal end portion excluding the molding compound, and the at least one signal pin being arranged along a longitudinal axis that is orthogonal to the plane of the substrate.

13. The method of claim 12, wherein coupling at least one signal pin with the second side of the substrate includes:
 placing the distal end portion of the at least one signal pin in a cavity of a leveling tool;
 positioning a foot of the proximal end portion on the second side of the substrate, such that a spring included in the leveling tool, a spring portion of the proximal end portion, and a mechanical stop portion of the proximal end portion determine a position of the at least one signal pin along the longitudinal axis; and
 soldering a surface of the foot to the second side of the substrate.

14. The method of claim 12, further comprising:
 after coupling the plurality of semiconductor die with the second side of the substrate and before coupling the at least one signal pin with the second side of the substrate, forming a plurality of wire bonds between the substrate and respective semiconductor die of the plurality of semiconductor die.

15. The method of claim 12, wherein the molding compound is a first molding compound, the method further comprising:
 coupling at least one power tab with the second side of the substrate; and
 transfer molding the electronic device assembly to encapsulate, with a second molding compound:
  the plurality of semiconductor die;
  the proximal end portion of at least one signal pin;
  at least a portion of the substrate;
  a portion of the first molding compound, such that a surface of the first molding compound is coplanar with a surface of the second molding compound; and
  a portion of the at least one power tab.

16. An electronic device assembly comprising:
 a thermal-dissipation appliance;
 a substrate arranged in a plane, the substrate having a first side coupled with the thermal-dissipation appliance and a second side opposite the first side;
 a plurality of semiconductor die disposed on the second side of the substrate; and
 a plurality of signal pins, each signal pin of the plurality of signal pins including:
  a proximal end portion coupled with the second side of the substrate;
  a distal end portion; and
  a medial portion disposed between the proximal end portion and the distal end portion, the medial portion being pre-molded in a molding compound, the proximal end portion and the distal end portion excluding the molding compound, each signal pin of the plurality of signal pins being arranged along a respective longitudinal axis that is orthogonal to the plane of the substrate.

17. The electronic device assembly of claim 16, wherein the molding compound is a first molding compound, the electronic device assembly further comprising:

at least one power tab coupled with the second side of the substrate; and a second molding compound encapsulating:
the plurality of semiconductor die;
respective proximal end portions of the plurality of signal pins;
at least a portion of the substrate;
respective portions of the first molding compound of the plurality of signal pins, such that respective surfaces of the first molding compound of the plurality of signal pins are coplanar with a surface of the second molding compound; and
a portion of the at least one power tab.

18. The electronic device assembly of claim 17, wherein a surface of the at least one power tab is exposed through the surface of the second molding compound.

19. The electronic device assembly of claim 18, wherein the at least one power tab is coupled with the substrate via a post.

20. The electronic device assembly of claim 17, wherein:
the surface of the second molding compound is a first surface of the second molding compound;
the portion of the at least one power tab is a first portion; and
a second portion of the at least one power tab is disposed outside the second molding compound, the second portion of the at least one power tab extending out of the second molding compound at a second surface of the second molding compound, the second surface of the second molding compound being non-parallel with the first surface of the second molding compound.

* * * * *